United States Patent
Choi et al.

(10) Patent No.: US 9,772,435 B2
(45) Date of Patent: Sep. 26, 2017

(54) FLEXIBLE DISPLAY APPARATUS

(71) Applicant: Samsung Display Co., Ltd., Yongin-si, Gyeonggi-do (KR)

(72) Inventors: Suk Choi, Yongin-si (KR); Heeyoung Lee, Yongin-si (KR); Ohjeong Kwon, Yongin-si (KR); Sunghwan Hong, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/249,055

(22) Filed: Aug. 26, 2016

(65) Prior Publication Data

US 2017/0115438 A1      Apr. 27, 2017

(30) Foreign Application Priority Data

Oct. 26, 2015   (KR) .................. 10-2015-0148825

(51) Int. Cl.
*G02B 5/30* (2006.01)
*H01L 51/52* (2006.01)
*H01L 27/32* (2006.01)
*H01L 51/56* (2006.01)

(52) U.S. Cl.
CPC ........ *G02B 5/3016* (2013.01); *H01L 27/3232* (2013.01); *H01L 27/3246* (2013.01); *H01L 27/3258* (2013.01); *H01L 27/3276* (2013.01); *H01L 51/5256* (2013.01); *H01L 51/5293* (2013.01); *H01L 51/56* (2013.01); *H01L 2251/5338* (2013.01)

(58) Field of Classification Search
CPC .............. G02B 5/3016; H01L 51/5293; H01L 51/5256; H01L 27/3232; H01L 27/3258; H01L 27/3246; H01L 51/56; H01L 27/3276
See application file for complete search history.

(56) References Cited

U.S. PATENT DOCUMENTS

| | | | |
|---|---|---|---|
| 7,911,562 B2 * | 3/2011 | Okabe | G02F 1/1337 349/127 |
| 9,076,985 B2 * | 7/2015 | Sakamoto | H01L 51/5246 |
| 9,214,640 B2 * | 12/2015 | Lee | H01L 51/0097 |
| 2006/0141171 A1 | 6/2006 | Tazaki et al. | |
| 2012/0327336 A1 | 12/2012 | Jeon et al. | |

FOREIGN PATENT DOCUMENTS

| | | |
|---|---|---|
| JP | 2006-209098 | 8/2006 |
| KR | 10-2011-0054765 | 5/2011 |
| KR | 10-2013-0000310 | 1/2013 |
| KR | 10-2013-0072781 | 7/2013 |

* cited by examiner

*Primary Examiner* — William Coleman
(74) *Attorney, Agent, or Firm* — Knobbe Martens Olson & Bear LLP

(57) ABSTRACT

A flexible display apparatus includes a flexible substrate, a display disposed over the flexible substrate, a thin film encapsulation layer disposed over an hermetically sealing the display, a phase delay layer disposed over the thin film encapsulation layer, and a polarizer film disposed over the phase delay layer, in which the phase delay layer comprises a first alignment film and a liquid crystal layer over the first alignment film, the liquid crystal layer having liquid crystal and reactive liquid crystal, where an amount of unhardened reactive liquid crystal in the liquid crystal layer is from about 100 ppm/inch$^2$ to about 220 ppm/inch$^2$.

18 Claims, 7 Drawing Sheets

FLEXIBLE DISPLAY APPARATUS

CROSS-REFERENCE TO RELATED APPLICATION

This application claims priority to, and the benefit of, Korean Patent Application No. 10-2015-0148825, filed on Oct. 26, 2015, in the Korean Intellectual Property Office, the disclosure of which is incorporated herein in its entirety by reference.

BACKGROUND

Field

One or more embodiments relate to a flexible display apparatus.

Description of the Related Technology

Organic light-emitting display apparatuses, which are self-illuminating display apparatuses, have attracted wide attention as next-generation display apparatuses due to their merits of wide viewing angles, superior contrast, and fast response speeds.

An organic light-emitting display apparatus is manufactured to be light and thin so as to be portable and usable outdoors. When an image is viewed outdoors, contrast and visibility presented by a flat panel display apparatus may be deteriorated due to strong external light such as for example sunlight. Also, when the flat panel display apparatus is used indoors, visibility may be deteriorated due to various external lights including for example an indoor fluorescent lamp.

In order to prevent the deterioration of visibility due to external lights, a circular polarized film attached on the entire surface of an organic light-emitting display apparatus has been used. This is to prevent reflection of external light that is incident on the organic light-emitting display apparatus so that luminance of reflected external light is lowered, thereby preventing deterioration of visibility due to the external light.

However, since the circular polarized film is manufactured by combining multiple layers of films, a manufacturing process of the circular polarized film is complicated and manufacturing costs of the circular polarized film are high. Furthermore, since the circular polarized film is thick, it is difficult to manufacture a thin display apparatus.

SUMMARY OF CERTAIN INVENTIVE ASPECTS

One or more embodiments include a flexible display apparatus.

Additional aspects will be set forth in part in the description which follows and, in part, will be apparent from the description, or may be learned by practice of the presented embodiments.

According to one or more embodiments, a flexible display apparatus includes a flexible substrate, a display disposed over the flexible substrate, a thin film encapsulation layer disposed over and hermetically sealing the display, a phase delay layer disposed over the thin film encapsulation layer, and a polarizer film disposed over the phase delay layer, in which the phase delay layer comprises a first alignment film and a liquid crystal layer where the liquid crystal layer includes liquid crystal and reactive liquid crystal, and the amount of unhardened reactive liquid crystal in the liquid crystal layer is from about 100 ppm/inch$^2$ to about 220 ppm/inch$^2$.

The reactive liquid crystal may be included in the liquid crystal layer at a rate of about 3 wt % to about 30 wt %.

The reactive liquid crystal may include nematic liquid crystal including an end-group of an acrylate group or a methacrylate group.

The reactive liquid crystal may include monoacrylate-type reactive liquid crystal and diacrylate-type reactive liquid crystal, and a content ratio of the monoacrylate-type reactive liquid crystal and the diacrylate-type reactive liquid crystal may be about 1:1.5 to about 1:4.

The phase delay layer may further include a second alignment film disposed on the liquid crystal layer.

The display may include a display area and a non-display area outside the display area, the non-display area may include a power wire and a dam portion, and the dam portion may contact at least an outer edge of the power wire by overlapping the at least an outer edge of the power wire.

The display may include a thin film transistor, an organic light-emitting device electrically connected to the thin film transistor, a planarization film between the thin film transistor and the organic light-emitting device, and a pixel-defining film defining a pixel area of the organic light-emitting device, and the dam portion may include a same material as at least one of the planarization film and the pixel-defining film.

The thin film encapsulation layer may include at least one inorganic film and at least one organic film, and the at least one organic film may be disposed inside the dam portion.

The at least one inorganic film may cover the dam portion.

According to one or more embodiments, a flexible display apparatus includes a flexible substrate, a display disposed over the flexible substrate, the display including a display area and a non-display area outside the display area, a thin film encapsulation layer disposed over and hermetically sealing the display, and a polarizer layer disposed over the thin film encapsulation layer, in which the polarizer layer may include a first alignment film, a second alignment film, and a liquid crystal layer between the first alignment film and the second alignment film, and the liquid crystal layer may include non-reactive liquid crystal and reactive liquid crystal, and the reactive liquid crystal is included in the liquid crystal layer at a rate from about 3 wt % to about 30 wt %.

An amount of unhardened reactive liquid crystal in the liquid crystal layer may be from about 100 ppm/inch$^2$ to about 220 ppm/inch$^2$.

The reactive liquid crystal may include nematic liquid crystal including an end-group of an acrylate group or a methacrylate group.

The reactive liquid crystal may include monoacrylate-type reactive liquid crystal and diacrylate-type reactive liquid crystal, and a content ratio of the monoacrylate-type reactive liquid crystal and the diacrylate-type is about 1:1.5 to about 1:4.

The polarizer layer may further include a polarizer film disposed on the phase delay layer.

The non-display area may include a power wire and a dam portion, and the dam portion may contact at least an outer edge of the power wire by overlapping the at least an outer edge of the power wire.

The display may include a thin film transistor, an organic light-emitting device electrically connected to the thin film transistor, a planarization film between the thin film transistor and the organic light-emitting device, and a pixel-defining film defining a pixel area of the organic light-emitting device, and the dam portion may include a same material as at least one of the planarization film and the pixel-defining film.

The thin film encapsulation layer may include a plurality of inorganic films, and a plurality of organic films that are alternately stacked with the plurality of inorganic films, the plurality of organic films may be disposed inside the dam portion, and the plurality of inorganic films may cover the dam portion.

The plurality of inorganic films may contact each other outside the dam portion.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION OF CERTAIN INVENTIVE EMBODIMENTS

Figure 1:
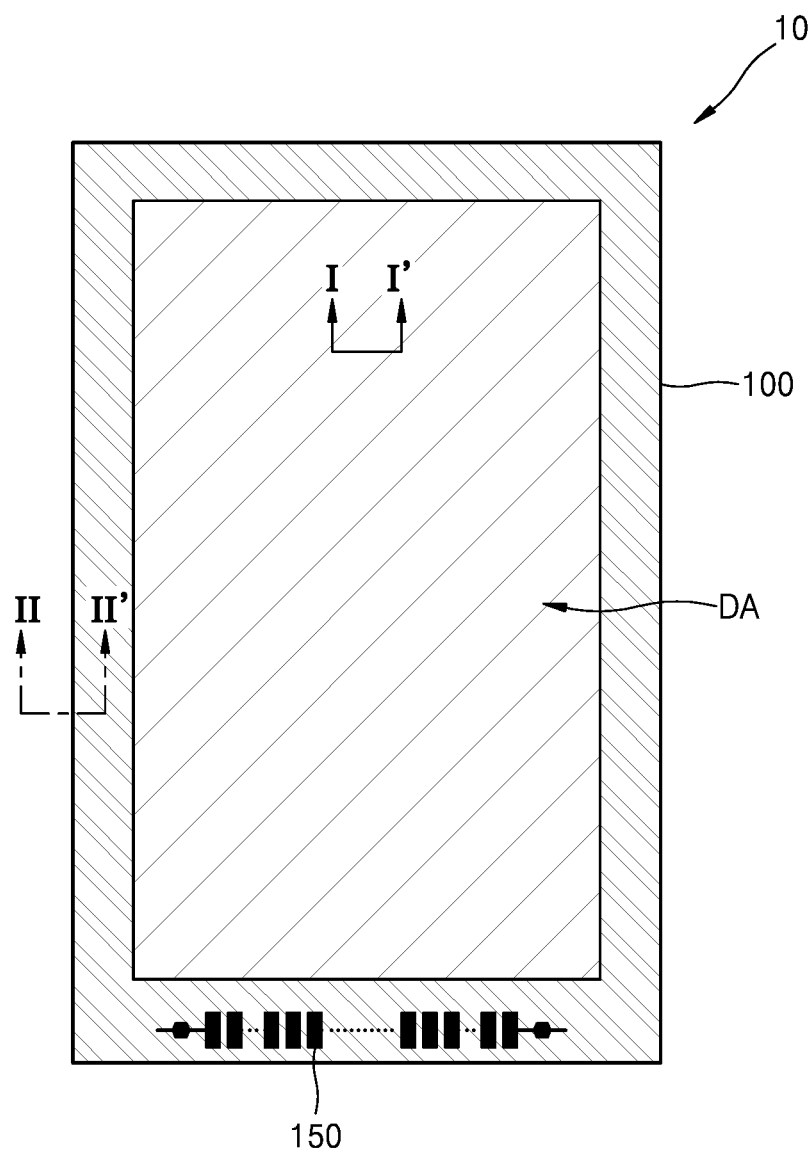
FIG. 1 is a schematic plan view of a flexible display apparatus according to an embodiment.

As the inventive concepts allow for various changes and numerous embodiments, example embodiments will be illustrated in the drawings and described in detail in the written description. However, this is not intended to limit the present inventive concepts to particular modes of practice, and it is to be appreciated that all changes, equivalents, and substitutes that do not depart from the spirit and technical scope of the present inventive concepts are encompassed in the present inventive concepts. In the description of the present inventive concepts, certain detailed explanations of the related art are omitted when it is deemed that they may unnecessarily obscure the essence of the inventive concepts.

While such terms as "first," "second," etc., may be used to describe various components, such components must not be limited to the above terms. The above terms are used only to distinguish one component from another.

The terms used in the present specification are merely used to describe certain embodiments, and are not intended to limit the present inventive concepts. An expression used in the singular encompasses the expression of the plural, unless it has a clearly different meaning in the context. Furthermore, each element illustrated in the drawings may be exaggerated, omitted, or schematically illustrated for convenience of explanation and clarity. The illustrated size of each element does not substantially reflect its actual size.

Reference will now be made in detail to certain embodiments, examples of which are illustrated in the accompanying drawings, wherein like reference numerals generally refer to like elements throughout. In this regard, the presented embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Figure 2:
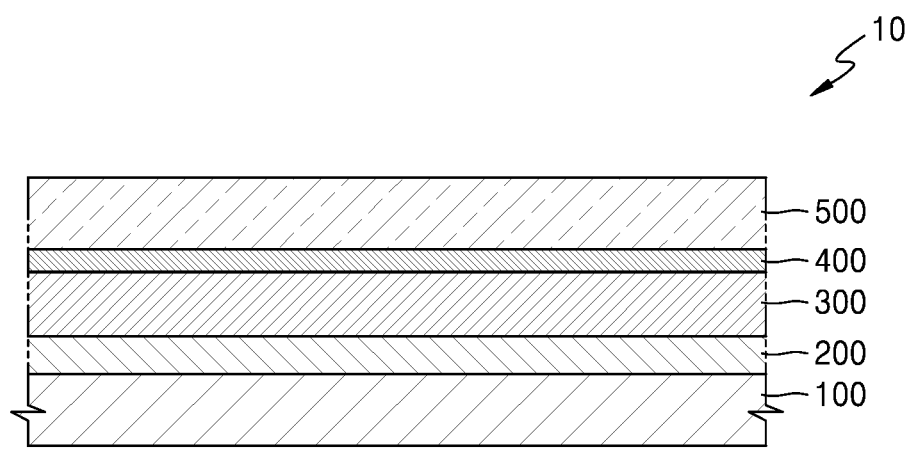
FIG. 2 is a schematic cross-sectional view taken along a line I-I' of FIG. 1.
Figure 3:
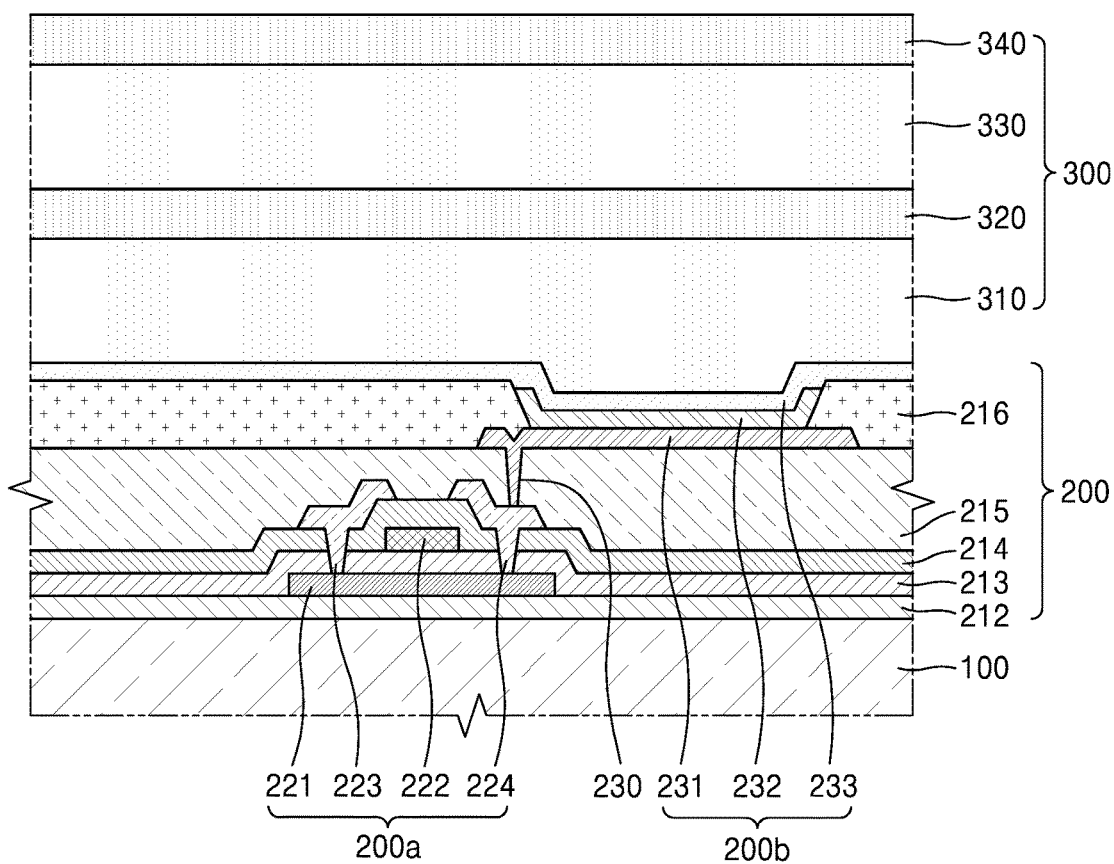
FIG. 3 is a cross-sectional view schematically illustrating an example of a display and a thin film encapsulation layer of the flexible display apparatus of FIG. 2.
Figure 4:
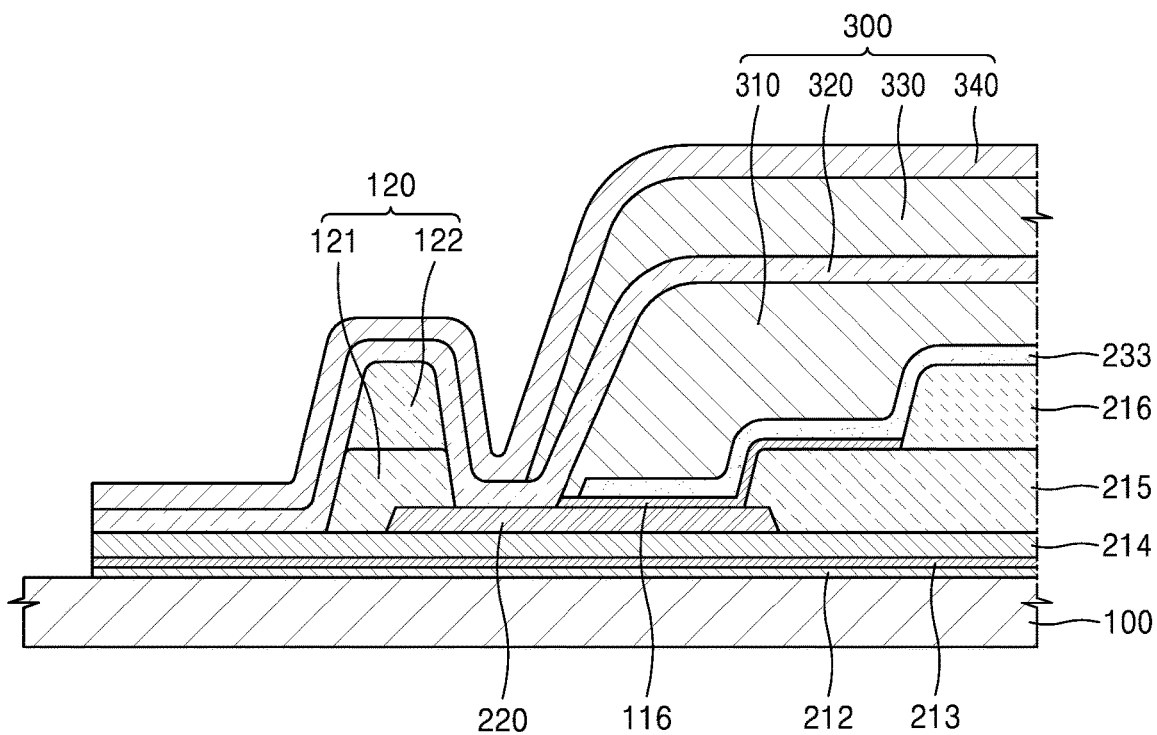
FIG. 4 is a schematic cross-sectional view taken along a line II-II' of FIG. 1.
Figure 5:
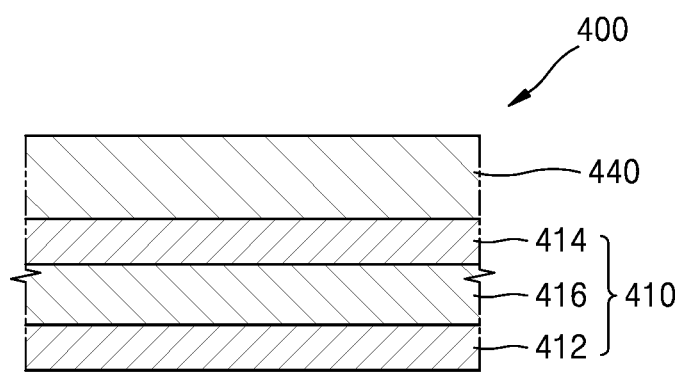
FIG. 5 is a cross-sectional view schematically illustrating an example of a polarized layer of the flexible display apparatus of FIG. 2.
Figure 6:
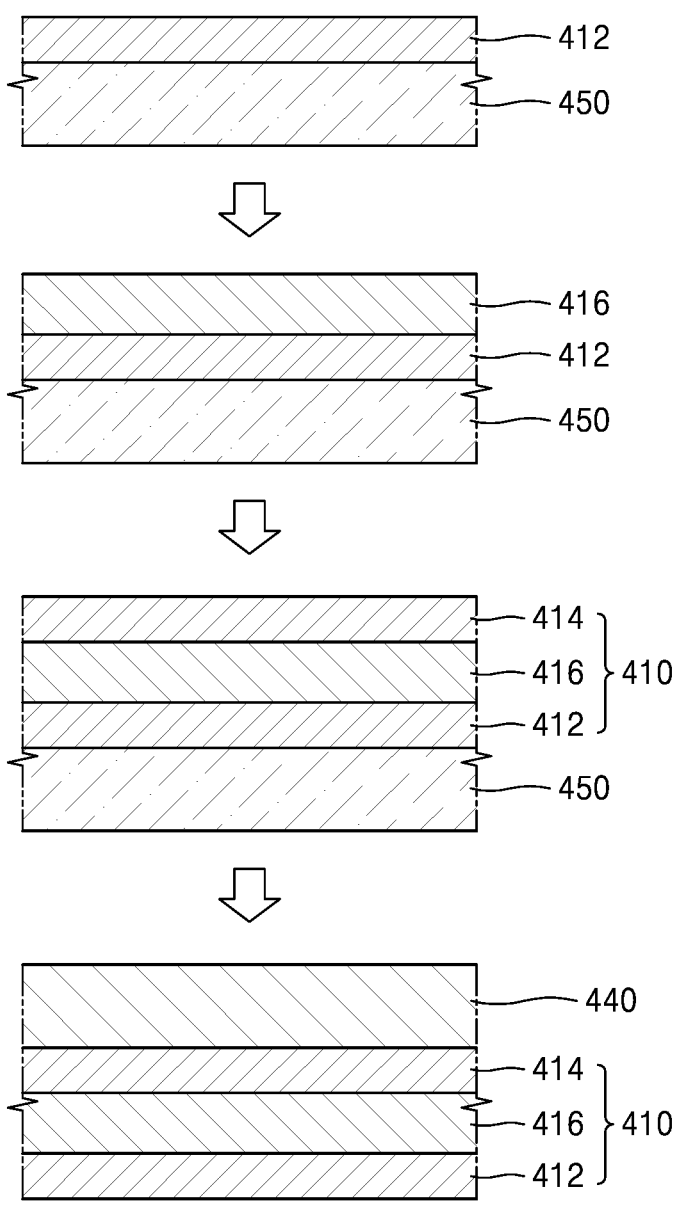
FIG. 6 is a cross-sectional view schematically illustrating a method of manufacturing the polarized layer of FIG. 5.
Figure 7:
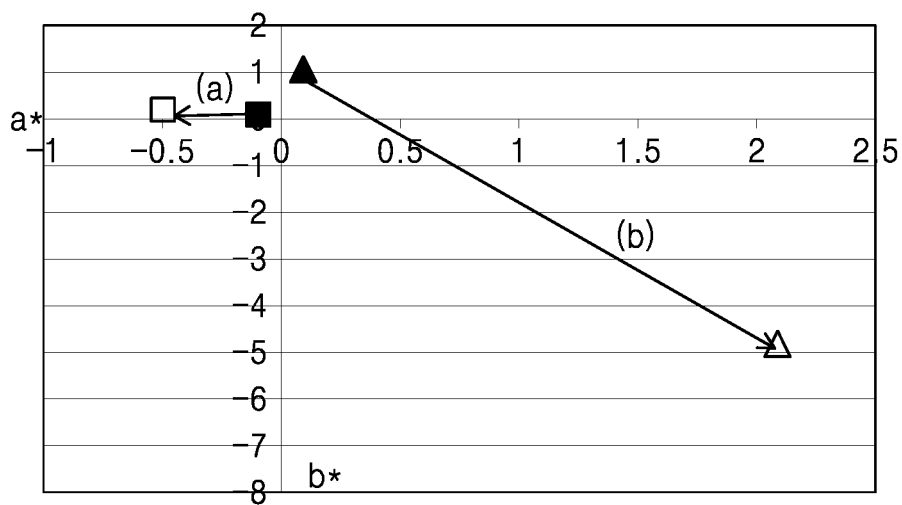
FIG. 7 is a graph schematically showing a change of a phase difference in the flexible display apparatus of FIG. 1.

FIG. 1 is a schematic plan view of a flexible display apparatus 10 according to an embodiment. FIG. 2 is a schematic cross-sectional view taken along a line I-I' of FIG. 1. FIG. 3 is a cross-sectional view schematically illustrating an example of a display and a thin film encapsulation layer of the flexible display apparatus 10 of FIG. 2. FIG. 4 is a schematic cross-sectional view taken along a line II-II' of FIG. 1. FIG. 5 is a cross-sectional view schematically illustrating an example of a polarized layer of the flexible display apparatus 10 of FIG. 2. FIG. 6 is a cross-sectional view schematically illustrating a method of manufacturing the polarized layer of FIG. 5. FIG. 7 is a graph schematically showing a change of a phase difference in the flexible display apparatus 10 of FIG. 1.

First, referring to FIGS. 1 to 5, the flexible display apparatus 10 according to an embodiment may include a substrate 100, a display 200 on the substrate 100, a thin film encapsulation layer 300 for hermetically sealing the display 200, a polarizer layer 400 on the thin film encapsulation layer 300. Furthermore, a cover layer 500 may be further arranged on the polarizer layer 400.

The substrate 100 may include a plastic material having flexibility. For example, the substrate 100 may include polyethersulphone (PES), polyacrylate (PAR), polyetherimide (PEI), polyethyelenen napthalate (PEN), polyethyelene-terepthalate (PET), polyphenylene sulfide (PPS), polyallylate, polyimide, polycarbonate (PC), cellulose triacetate (TAC), or cellulose acetate propionate (CAP).

When the flexible display apparatus 10 is of a bottom emission type that embodies an image in a direction toward the substrate 100, the substrate 100 includes a transparent material. However, when the flexible display apparatus 10 is a top emission type that embodies an image in a direction toward the thin film encapsulation layer 300, the substrate 100 does not need to include a transparent material and the substrate 100 may include opaque metal having flexibility. When the substrate 100 includes metal, the substrate 100 may include one or more materials of iron, chromium, manganese, nickel, titanium, molybdenum, stainless steel (SUS), Invar alloy, Inconel alloy, and Kovar alloy. Furthermore, the substrate 100 may include of metal foil.

The display 200 may be disposed on the substrate 100. The display 200 may include a display area DA where an image a user recognizes is embodied, and a non-display area outside the display area DA. A power wire 220 may be arranged in the non-display area. Furthermore, a pad portion 150 for transmitting an electric signal from a power supply apparatus (not shown) or a signal generation apparatus (not shown) to the display area DA may be arranged in the non-display area.

The display 200 may include, for example, a thin film transistor 200a and an organic light-emitting device 200b. However, the present disclosure is not limited thereto, and the display 200 may include a variety of types of display devices. In the following description, the display 200 is described in detail with reference to FIG. 3.

A buffer layer 212 may be formed on the substrate 100. The buffer layer 212 prevents intrusion of impurities into the substrate 100 and provides a flat surface on the substrate 100. The buffer layer 212 may include, for example, inorganic materials such as silicon oxide, silicon nitride, silicon oxynitride, aluminum oxide, aluminum nitride, titanium oxide, or titanium nitride, or organic materials such as polyimide, polyester, or acrylic, and may include layers of the above-described materials.

The thin film transistor 200a may be formed over the substrate 100. The thin film transistor 200a may include an active layer 221, a gate electrode 222, a source electrode 223, and a drain electrode 224.

The active layer 221 may include an inorganic semiconductor such as for example silicon, or an organic semiconductor. Furthermore, the active layer 221 has a source region, a drain region, and a channel region between the source region and the drain region. For example, when the active layer 221 is formed using amorphous silicon, an amorphous silicon layer is formed over the entire surface of the substrate 100 and crystallized to form a polycrystalline silicon layer. The polycrystalline silicon layer is patterned, and then, a source region and a drain region at an edge side of the active layer 221 are doped with impurities, thereby forming the active layer 221 including the source region, the drain region, and the channel region between the source region and the drain region.

A gate insulation film 213 is formed over the active layer 221. The gate insulation film 213 may include an inorganic material such as SiNx or $SiO_2$ to insulate the active layer 221 and the gate electrode 222 from each other.

The gate electrode 222 is formed in a certain area on an upper surface of the gate insulation film 213. The gate electrode 222 is connected to a gate line (not shown) for applying an on/off signal of the thin film transistor 200a. The gate electrode 222 may include, for example, Au, Ag, Cu, Ni, Pt, Pd, Al, or Mo, or an alloy such as, for example, Al:Nd alloy or Mo:W alloy. However, the present disclosure is not limited thereto, and the gate electrode 222 may include various materials by taking into account design conditions.

An interlayer insulation film 214 that is formed over the gate electrode 222 may include an inorganic material such as SiNx or $SiO_2$ to insulate between the gate electrode 222 and the source electrode 223, and between the gate electrode 222 and the drain electrode 224.

The source electrode 223 and the drain electrode 224 are formed over the interlayer insulation film 214. The interlayer insulation film 214 and the gate insulation film 213 expose the source region and the drain region of the active layer 221. The source electrode 223 and the drain electrode 224 respectively contact the exposed source and drain regions of the active layer 221.

The source electrode 223 and the drain electrode 224 may include one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or a multilayer.

Although FIG. 3 illustrates the thin film transistor 200a of a top gate type sequentially including the active layer 221, the gate electrode 222, and the source electrode 223 and the drain electrode 224, the present disclosure is not limited thereto. The gate electrode 222 may be under the active layer 221 in other embodiments.

The thin film transistor 200a is electrically connected to the organic light-emitting device 200b and applies a signal to the organic light-emitting device 200b to drive it. The thin film transistor 200a may be protected by being covered with a planarization film 215.

The planarization film 215 may be an inorganic insulation film and/or organic insulation film. An inorganic insulation film may include, for example, $SiO_2$, SiNx, SiON, $Al_2O_3$, $TiO_2$, $Ta_2O_5$, $HfO_2$, $ZrO_2$, BST, or PZT, whereas an organic insulation film may include, for example, a general common polymer (PMMA, PS), a polymer derivative having a phenol-based group, an acrylic-based polymer, an imide-based polymer, an allylether-based polymer, an amide-based polymer, a fluorine-based polymer, a p-xylene-based polymer, a vinyl alcohol-based polymer, and a blend thereof. Furthermore, the planarization film 215 may include a composite laminate of an inorganic insulation film and an organic insulation film.

The organic light-emitting device 200b may be formed over the planarization film 215. The organic light-emitting device 200b may include a pixel electrode 231, an intermediate layer 232, and a counter electrode 233.

The pixel electrode 231 is formed on the planarization film 215, and is electrically connected to the drain electrode 224 via a contact hole 230 formed in the planarization film 215.

The pixel electrode 231 may be a reflective electrode, and may include a reflection film including, for example, Ag, Mg, Al, Pt, Pd, Au, Ni, Nd, Ir, Cr, and a compound thereof, and a transparent or semi-transparent electrode layer formed on the reflective film. The transparent or semi-transparent electrode layer may include at least one of, for example, indium tin oxide (ITO), indium zinc oxide (IZO), zinc oxide (ZnO), indium oxide (In2O3), indium gallium oxide (IGO), and aluminum zinc oxide (AZO).

The counter electrode 233 disposed to face the pixel electrode 231 may be a transparent or semi-transparent electrode, and may include a metal thin film having a low work function and including, for example, Li, Ca, LiF/Ca, LiF/Al, Al, Ag, Mg, and a compound thereof. Furthermore, an auxiliary electrode layer or a bus electrode may be formed, on the metal thin film, including a material for forming a transparent electrode, such as, for example, ITO, IZO, ZnO, or $In_2O_3$.

Accordingly, the counter electrode 233 may transmit therethrough light emitted from an organic light-emitting layer (not shown) included in the intermediate layer 232. In other words, the light emitted from the organic light-emitting layer may proceed toward the counter electrode 233 directly or by being reflected by the pixel electrode 231 that is a reflective electrode.

However, the display 200 is not limited to a top emission type, and may be of a bottom emission type in which the light emitted from the organic light-emitting layer proceeds toward the substrate 100. In this case, the pixel electrode 231 may be a transparent or semi-transparent electrode, the counter electrode 233 may be a reflective electrode. Furthermore, the display 200 may be of a bidirectional emission type in which light is emitted in two directions toward the top surface and the bottom surface.

A pixel-defining film 216 includes an insulation material on the pixel electrode 231. The pixel-defining film 216 may include one or more organic insulation materials such as polyimide, polyamide, acrylic resin, benzocyclobutene, and phenol resin, and be formed by a method such as spin coating, for example. The pixel-defining film 216 exposes a certain area of the pixel electrode 231, and the intermediate layer 232 including the organic light-emitting layer is located in the exposed area of the pixel electrode 231.

The organic light-emitting layer included in the intermediate layer 232 may be a low molecular organic material or a polymer organic material. The intermediate layer 232 may selectively further include functional layers such as a hole transport layer (HTL), a hole injection layer (HIL), an electron transport layer (ETL), and an electron injection layer (EIL), in addition to the organic light-emitting layer.

The thin film encapsulation layer 300 is arranged over the counter electrode 233. The thin film encapsulation layer 300 covers the display 200 overall and prevents intrusion of external moisture and oxygen into the display 200. The thin film encapsulation layer 300 may be formed in a size larger than an area of the display 200 so that all edges of the thin film encapsulation layer 300 may contact the substrate 100, thereby further firmly preventing intrusion of external air.

The thin film encapsulation layer 300 may include at least one of organic layers 310 and 330 and at least one of inorganic layers 320 and 340. The at least one of organic layers 310 and 330 and the at least one of inorganic layers 320 and 340 may be alternately stacked on each other. Although FIG. 3 illustrates that the thin film encapsulation layer 300 includes two inorganic layers 320 and 340 and two organic layers 310 and 330, the present disclosure is not limited thereto. The thin film encapsulation layer 300 may further include a plurality of additional inorganic layers and organic layers that are alternately arranged, and the number of stacks of the inorganic layer and the organic layer is not limited to those illustrated in FIG. 3.

The inorganic layers 320 and 340 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The organic layers 310 and 330 planarize steps due to the pixel-defining film 216 and may alleviate stress generated in the inorganic layer 320. Furthermore, when there are particles on the inorganic layer 320, the organic layers 310 and 330 may cover the inorganic layer 320.

The inorganic layers 320 and 340 may be formed to be larger than the organic layers 310 and 330. Accordingly, as illustrated in FIG. 4, the inorganic layers 320 and 340 may contact each other outside the edges of the organic layers 310 and 330. Accordingly, the intrusion of external moisture or oxygen may be prevented more effectively.

As illustrated in FIG. 4, a dam portion 120 may be located in the non-display area outside the display area DA. In addition, the non-display area may include various circuit patterns such as the power wire 220 and a static electricity prevention pattern.

The power wire 220 may include a common voltage ELVSS line and a drive voltage ELVDD line, and may include the same material as the source electrode 223 and the drain electrode 224. Although FIG. 4 illustrates the common voltage ELVSS line of the power wire 220 and an example in which the common voltage ELVSS line and the counter electrode 233 are connected via the wiring 116, the present disclosure is not limited thereto. In some embodiments, the common voltage ELVSS line and the counter electrode 233 may directly contact each other.

When the organic films 310 and 330 of the thin film encapsulation layer 300 are formed, the dam portion 120 blocks a flow of an organic material for forming the organic films 310 and 330 in a direction toward the edge of the substrate 100 so as to prevent formation of edge tails of the organic films 310 and 330. The dam portion 120 may be formed to surround the display area DA.

The dam portion 120 may include the same material as at least one of the planarization film 215 and the pixel-defining film 216. In an example, the dam portion 120 may include a first layer 121 including the same material as that of the planarization film 215, and a second layer 122, formed on the first layer 121, and including the same material as that of the pixel-defining film 216. However, the present disclosure is not limited thereto, and the dam portion 120 may be formed in a single layer. Furthermore, the dam portion 120 may include two or more layers. When the dam portion 120 is a multilayer, the height of the dam portion 120 may increase as the dam portion 120 is located at an outer position in the substrate 100.

The dam portion 120 may be formed to overlap at least a part of the power wire 220. For example, the dam portion 120 may overlappingly contact at least an outer edge of the power wire 220. The dam portion 120 including the same material as that of at least one of the planarization film 215 and the pixel-defining film 216 may have a superior bonding force with metal, compared to an inorganic material. Accordingly, when the dam portion 120 is formed in contact with the power wire 220 that is formed of a metal material, the dam portion 120 may have a superior bonding force and may be formed stably. Although FIG. 4 illustrates an example in which the dam portion 120 overlaps the outer edge of the power wire 220, the present disclosure is not limited thereto, and the dam portion 120 may be formed only on the power wire 220 to cover the power wire 220.

When the organic films 310 and 330 are formed, as the dam portion 120 blocks the flow of an organic material in a direction toward the edge of the substrate 100, the organic films 310 and 330 are located inside the dam portion 120.

In contrast, the inorganic films 320 and 340 may extend to the outside of the dam portion 120, and the inorganic films 320 and 340 may contact each other outside the dam portion 120. Furthermore, at least one of the inorganic films 320 and 340 may contact the interlayer insulation film 214 outside the dam portion 120. Accordingly, the intrusion of external moisture through a lateral surface may be prevented and a bonding force of the thin film encapsulation layer 300 may be improved. Furthermore, at least one of the inorganic films 320 and 340 may contact the upper surface of the substrate 100 by passing through an end portion of the interlayer insulation film 214, and furthermore, may contact the lateral sides of the gate insulation film 213 and the interlayer insulation film 214. Accordingly, deterioration of encapsulation characteristics of the thin film encapsulation layer 300 and removal of the thin film encapsulation layer 300 due to the lamination of the edges of the inorganic films 320 and 340 may be prevented.

The polarizer layer 400 transmits therethrough only light oscillating in the same direction as a polarization axis, and absorbs or reflects light oscillating in the other directions, among the light output from the display 200.

In the following description, the polarizer layer 400 and a manufacturing method thereof are described with reference to FIGS. 5 and 6.

The polarizer layer 400 may include a phase delay layer 410 that changes a linearly polarized light to a circularly polarized light, or a circularly polarized light to a linearly polarized light, by providing a phase difference of λ/4 to the two polarized light components that are perpendicular to each other, and a polarizer film 440 aligning the direction of light transmitting through the phase delay layer 410 and dividing the light into two polarization components perpendicular to each other to transmit therethrough only one of the two polarization components and absorb or scatter the other component.

The phase delay layer 410 may include a first alignment film 412, a liquid crystal layer 416 on the first alignment film 412, and a second alignment film 414 on the liquid crystal layer 416.

The first alignment film 412 may be formed by coating a composite for forming an alignment film on a base member 450 and then drying and hardening the composite. The first alignment film 412 may have a thickness of about 0.1 μm to about 0.5 μm, but the present disclosure is not limited thereto.

The base member 450 may include glass or a transparent plastic film. The plastic film may be polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), or cellulose acetate propionate (CAP).

The composite for forming an alignment film may be in the form of a solution obtained as a polymer or a coupling agent is resolved in an organic solvent and is coated on the base member 450 by spin coating or gravure coating. After the coating, a polarized light is irradiated onto a coated surface and thus an alignment force may be provided to the first alignment film 412 in a polarization direction of the polarized light.

The polymer included in the composite for forming an alignment film may be, for example, polymethyl methacrylate, acrylic acid-methacrylic acid copolymer, styrene-maleimide copolymer, polyvinyl alcohol, modified polyvinyl alcohol, gelatin, styrene-vinyltoluene copolymer, chlorosulfonated polyethylene, nitrocellulose, polyvinyl chloride, chlorinated polyolefin, polyester, polyimide, vinyl acetate-vinyl chloride copolymer, ethylene-vinyl acetate copolymer, carboxymethyl cellulose, polyethylene, polypropylene, or polycarbonate. Furthermore, the coupling agent may be a silane coupling agent.

The liquid crystal layer 416 may include liquid crystal and reactive liquid crystal. An example of liquid crystal may be nematic liquid crystal, which is non-reactive and has no reaction group. The reactive liquid crystal may include, for example, an end-group capable of performing radical polymerization as a mesogen that expresses a nematic liquid crystal phase. A polymerizable end-group may include an acrylate group or a methacrylate group. In an example, the reactive liquid crystal may include a monoacrylate-type reactive liquid crystal and a diacrylate-type reactive liquid crystal. In this state, a content ratio of the monoacrylate-type reactive liquid crystal and the diacrylate-type reactive liquid crystal may be about 1:1.5 to about 1:4.

The liquid crystal layer 416 may be formed by coating a composite for forming a liquid crystal layer including liquid crystal and reactive liquid crystal on the first alignment film 412 and then drying and hardening the composite. The composite for forming a liquid crystal layer is in the form of a solution obtained as additives such as a polymerization initiator or a hardener in addition to the liquid crystal and the reactive liquid crystal are resolved in an organic solvent, coated on the first alignment film 412 by spin coating or gravure coating, and then hardened.

When an ultraviolet ray is irradiated onto the composite for forming a liquid crystal layer coated on the first alignment film 412, the reactive liquid crystal are polymerized and aligned in the same direction as the alignment direction of the first alignment film 412, and an optical axis is formed in the alignment direction of the first alignment film 412. Furthermore, the liquid crystal having no reaction group, which is included in the composite for forming a liquid crystal layer, is aligned in the same direction as the alignment direction of reactive liquid crystal through a π-π interaction with the reactive liquid crystal forming the optical axis, and the liquid crystal layer 416 may perform a function of a λ/4 phase film. As such, since the liquid crystal layer 416 may be formed by a coating process and have a thickness as thin as about 0.5 μm to about 1.5 μm, the manufacturing of the polarizer layer 400 may be simplified and the thickness of the polarizer layer 400 may be reduced compared to a case of attaching a λ/4 phase film on a polarization element in a related art.

The reactive liquid crystal may be included in the liquid crystal layer 416 at about 3 wt % to about 30 wt %. When a content of the reactive liquid crystal is less than 3 wt %, the liquid crystal layer 416 is difficult to be aligned with a generally uniform directivity. In contrast, when the content of the reactive liquid crystal is greater than about 30 wt %, a remaining amount of unhardened reactive liquid crystal in the liquid crystal layer 416 may increase. When the amount of the unhardened reactive liquid crystal in the liquid crystal layer 416 increases, a degree of hardening of the liquid crystal layer 416 decreases, and a phase difference of the liquid crystal layer 416 decreases in a high temperature and high moisture environment, thereby generating a change in a sense of color. Accordingly, the reactive liquid crystal may be included in the liquid crystal layer 416 at about 3 wt % to about 30 wt % so that the liquid crystal layer 416 may stably maintain uniform directivity.

Furthermore, the unhardened reactive liquid crystal may be included in the liquid crystal layer 416 at a rate of about 100 ppm/inch$^2$ to about 220 ppm/inch$^2$. When the content of the unhardened reactive liquid crystal is greater than about 220 ppm/inch$^2$, a phase difference of the liquid crystal layer 416 decreases in a high temperature and high moisture environment, thereby generating a change in a sense of color. In contrast, when the unhardened reactive liquid crystal is included in the liquid crystal layer 416 at a rate of less than about 100 ppm/inch$^2$, a degree of hardness of the liquid crystal layer 416 increases too high and thus damage such as cracks may be generated in the liquid crystal layer 416 during handling of the phase delay layer 410 or the polarizer layer 400.

Table 1 below shows a result of a change of a phase difference of the liquid crystal layer 416 according to an amount of the reactive liquid crystal remaining in the liquid crystal layer 416. FIG. 7 shows a result of expressing a change in a sense of color of the light passing through the polarizer layer 400 according to an amount of the reactive liquid crystal on a color coordination system. The liquid crystal layer 416 may include nematic liquid crystal and unhardened liquid crystal. The unhardened liquid crystal may include monoacrylate-type nematic reactive liquid crystal and diacrylate-type nematic reactive liquid crystal at a ratio of 1:4.

In Table 1 below, the content of unhardened liquid crystal signifies the amount of unhardened liquid crystal that is originally included in the liquid crystal layer 416. An amount of remaining unhardened liquid crystal signifies the amount of unhardened liquid crystal remaining in the liquid crystal layer 416 after the hardening. A change of a phase difference signifies a value of a change of a phase difference during transmission of light having a wavelength of 550 nm when the polarizer layer 400 is placed for 24 hours under the conditions of a high temperature of about 60° C. and high moisture of about 93%.

TABLE 1

|  | Content of unhardened liquid crystal (wt %) | Amount of remaining unhardened liquid crystal (ppm/inch$^2$) | Amount of change of a phase difference (nm) |
| --- | --- | --- | --- |
| Example embodiment 1 | 5 | 217 | 4 |
| Example embodiment 2 | 10 | 212 | 3 |
| Example embodiment 3 | 10 | 107 | 2 |
| Comparative example 1 | 1 | 107 | 2 |
| Comparative example 2 | 10 | 332 | 7 |

The amount of remaining unhardened liquid crystal is adjustable according to a hardening condition. As it seen from Table 1 above, as the content of the remaining unhardened liquid crystal in the liquid crystal layer 416 increases, an amount of a change of a phase difference increases. In particular, when the amount of the remaining unhardened liquid crystal is greater than 220 ppm/inch$^2$, the amount of a change of a phase difference is greater than 4 nm and thus a change in a sense of color may be recognized. The arrow (a) of FIG. 7 denotes a case in which the amount of the remaining unhardened liquid crystal is about 153 ppm/inch$^2$ and the arrow (b) of FIG. 7 denotes a case in which the amount of the remaining unhardened liquid crystal is about 350 ppm/inch$^2$. The arrow (b) of FIG. 7 may denote that a sense of color is changed toward red.

Accordingly, under a high temperature and high moisture environment, to reduce a change in the phase difference of the liquid crystal layer 416, the amount of the remaining unhardened liquid crystal in the liquid crystal layer 416 is maintained to be equal to or less than 220 ppm/inch$^2$. In contrast, when the unhardened reactive liquid crystal is included in the liquid crystal layer 416 at a rate of less than 100 ppm/inch$^2$, the a degree of hardness of the liquid crystal layer 416 increases too high and thus damage such as cracks may be generated in the liquid crystal layer 416 during handling of the phase delay layer 410 or the polarizer layer 400. Accordingly, the amount of the remaining unhardened liquid crystal in the liquid crystal layer 416 may be between about 100 ppm/inch$^2$ and about 220 ppm/inch$^2$.

In the case of comparative example 1, the amount of the remaining unhardened liquid crystal is about 107 ppm/inch$^2$ and the amount of a change of a phase difference is about 2 nm, and thus, no change in a sense of color is recognized. However, in the case of comparative example 1, since the amount of the originally contained unhardened liquid crystal is about 1 wt %, the liquid crystal layer 416 was difficult to be generally aligned with uniform directivity. In other words, in order to maintain the liquid crystal layer 416 stably with uniform directivity, the reactive liquid crystal may be included in the liquid crystal layer 416 at a rate of about 3 wt % to about 30 wt %.

Referring back to FIGS. 5 and 6, the second alignment film 414 is formed on the liquid crystal layer 416. In an example, the second alignment film 414 may be formed identically to the first alignment film 412. In other words, the second alignment film 414 may be formed by coating a composite for forming an alignment film on the liquid crystal layer 416 and then drying and hardening the composite. In another example, the second alignment film 414 may be formed by coating polymide or polyamide on the liquid crystal layer 416 and baking the polymide or polyamide, and then, an alignment direction of the second alignment film 414 may be formed by rubbing the sintered polymide or polyamide by using a rubbing roll.

As such, alignment properties of the liquid crystal layer 416 may be further improved by forming the second alignment film 414 on the liquid crystal layer 416. The second alignment film 414 may perform a function of a barrier layer to prevent migration of liquid crystal in the liquid crystal layer 416 toward a bonding layer (not shown) that bonds the phase delay layer 410 and the polarizer film 440.

The polarizer film 440 and the phase delay layer 410 may be bonded to each other on the bonding layer. Acrylic-based, polyurethane-based, polyisobutylene-based, styrenebutadienerubber (SBR)-based, rubber-based, polyvinyl ether-based, epoxy-based, melamine-based, polyester-based, phenol-based, or silicon-based resin, or a copolymer thereof may be used for the bonding layer.

After the polarizer film 440 and the phase delay layer 410 are bonded to each other, the base member 450 is removed, thereby manufacturing the polarizer layer 400.

Although it is not illustrated in the drawings, the polarizer layer 400 may further include a λ/2 phase delay layer. Although the λ/2 phase delay layer may have the same structure as the phase delay layer 410, liquid crystal may be aligned to perform a function of a λ/2 phase film.

Referring back to FIG. 2, the cover layer 500 is located over the polarizer layer 400 and protects the flexible display apparatus 10 from external shocks and scratches generated during usage. The cover layer 500 may include polymethyl methacrylate, polydimethylsiloxane, polyimide, acrylate, polyethylen terephthalate, or polyethylen naphthalate. However, the present disclosure is not limited thereto, and the cover layer 500 may include various materials such as, for example, a metal member. In some embodiments, the cover layer 500 may be formed by using a thin metal foil such as stainless steel (SUS).

As described above, a polarizer layer may have a thin thickness to be suitable for a flexible display apparatus, and a decrease in a phase difference between polarization components passing through a phase delay layer may be reduced under a high temperature and high moisture environment.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A flexible display apparatus comprising:
   a flexible substrate;
   a display disposed over the flexible substrate;
   a thin film encapsulation layer disposed over and hermetically sealing the display;
   a phase delay layer disposed over the thin film encapsulation layer; and
   a polarizer film disposed over the phase delay layer, wherein the phase delay layer comprises a first alignment film and a liquid crystal layer, and wherein the liquid crystal layer includes liquid crystal and reactive liquid crystal, and wherein an amount of unhardened reactive liquid crystal in the liquid crystal layer is from about 100 ppm/inch$^2$ to about 220 ppm/inch$^2$.

2. The flexible display apparatus of claim 1, wherein the reactive liquid crystal is included in the liquid crystal layer at a rate of about 3 wt % to about 30 wt %.

3. The flexible display apparatus of claim 1, wherein the reactive liquid crystal comprises nematic liquid crystal including an end-group of an acrylate group or a methacrylate group.

4. The flexible display apparatus of claim 1, wherein the phase delay layer further comprises a second alignment film disposed on the liquid crystal layer.

5. The flexible display apparatus of claim 1, wherein the display comprises a display area and a non-display area outside the display area,
wherein the non-display area comprises a power wire and a dam portion, and
wherein the dam portion contacts at least an outer edge of the power wire by overlapping the at least an outer edge of the power wire.

6. The flexible display apparatus of claim 3, wherein the reactive liquid crystal comprises monoacrylate-type reactive liquid crystal and diacrylate-type reactive liquid crystal, and a content ratio of the monoacrylate-type reactive liquid crystal and the diacrylate-type reactive liquid crystal is about 1:1.5 to about 1:4.

7. The flexible display apparatus of claim 5, wherein the display comprises a thin film transistor, an organic light-emitting device electrically connected to the thin film transistor, a planarization film between the thin film transistor and the organic light-emitting device, and a pixel-defining film defining a pixel area of the organic light-emitting device, and
wherein the dam portion comprises a same material as at least one of the planarization film and the pixel-defining film.

8. The flexible display apparatus of claim 5, wherein the thin film encapsulation layer comprises at least one inorganic film and at least one organic film, and the at least one organic film is disposed inside the dam portion.

9. The flexible display apparatus of claim 8, wherein the at least one inorganic film covers the dam portion.

10. A flexible display apparatus comprising:
a flexible substrate;
a display disposed over the flexible substrate, the display comprising a display area and a non-display area outside the display area;
a thin film encapsulation layer disposed over and hermetically sealing the display; and
a polarizer layer disposed over the thin film encapsulation layer,
wherein the polarizer layer comprises a first alignment film, a second alignment film, and a liquid crystal layer between the first alignment film and the second alignment film, and
wherein the liquid crystal layer comprises non-reactive liquid crystal and reactive liquid crystal, and the reactive liquid crystal is included in the liquid crystal layer at a rate from about 3 wt % to about 30 wt %.

11. The flexible display apparatus of claim 10, wherein an amount of unhardened reactive liquid crystal in the liquid crystal layer is from about 100 ppm/inch$^2$ to about 220 ppm/inch$^2$.

12. The flexible display apparatus of claim 10, wherein the polarizer layer further comprises a polarizer film disposed on the phase delay layer.

13. The flexible display apparatus of claim 10, wherein the non-display area comprises a power wire and a dam portion, and
the dam portion contacts at least an outer edge of the power wire by overlapping the at least an outer edge of the power wire.

14. The flexible display apparatus of claim 11, wherein the reactive liquid crystal comprises nematic liquid crystal including an end-group of an acrylate group or a methacrylate group.

15. The flexible display apparatus of claim 14, wherein the reactive liquid crystal comprises monoacrylate-type reactive liquid crystal and diacrylate-type reactive liquid crystal, and
a content ratio of the monoacrylate-type reactive liquid crystal and the diacrylate-type is about 1:1.5 to about 1:4.

16. The flexible display apparatus of claim 13, wherein the display comprises a thin film transistor, an organic light-emitting device electrically connected to the thin film transistor, a planarization film between the thin film transistor and the organic light-emitting device, and a pixel-defining film defining a pixel area of the organic light-emitting device, and
the dam portion comprises a same material as at least one of the planarization film and the pixel-defining film.

17. The flexible display apparatus of claim 13, wherein the thin film encapsulation layer comprises a plurality of inorganic films and a plurality of organic films that are alternately stacked with the plurality of inorganic films,
the plurality of organic films are disposed inside the dam portion, and
the plurality of inorganic films cover the dam portion.

18. The flexible display apparatus of claim 17, wherein the plurality of inorganic films contact each other outside the dam portion.

* * * * *